(12) United States Patent
Hwang et al.

(10) Patent No.: US 8,891,289 B2
(45) Date of Patent: Nov. 18, 2014

(54) TEN-TRANSISTOR DUAL-PORT SRAM WITH SHARED BIT-LINE ARCHITECTURE

(71) Applicant: National Chiao Tung University, Hsinchu (TW)

(72) Inventors: Wei Hwang, Hsinchu (TW); Dao-Ping Wang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/869,624

(22) Filed: Apr. 24, 2013

(65) Prior Publication Data
US 2014/0198562 A1    Jul. 17, 2014

(30) Foreign Application Priority Data

Jan. 15, 2013 (TW) .............................. 102101465 U

(51) Int. Cl.
*G11C 8/16* (2006.01)
*G11C 11/412* (2006.01)

(52) U.S. Cl.
CPC ................................... *G11C 11/412* (2013.01)
USPC ...................................... 365/154; 365/230.05

(58) Field of Classification Search
None
See application file for complete search history.

(56) References Cited

U.S. PATENT DOCUMENTS 7,092,279 B1 * 8/2006 Sheppard ..................... 365/154
7,660,149 B2   2/2010 Liaw

OTHER PUBLICATIONS

Dao-Ping Wang et al., "A 45 nm 10T Dual-Port SRAM with Shared Bit-Line Scheme for Low Power Operation", Journal of Low Power Elecronics, 2012, pp. 1-13, vol. 8, No. 4, American Scientific Publishers, United States of America.
Koji Nil et al., "Synchronous Ulta-High-Density 2RW Dual-Port 8T-SRAM with Circumvention of Simultaneous Common-Row-Access", IEEE Journal of Solid-State Circuits, Mar. 2009, pp. 977-986, vol. 44, No. 3.

* cited by examiner

*Primary Examiner* — James G Norman
(74) *Attorney, Agent, or Firm* — Muncy, Geissler, Olds & Lowe, P.C.

(57) ABSTRACT

A 10-transistor dual-port SRAM with shared bit-line architecture includes a first memory cell and a second memory cell. The first memory cell has a first storage unit, a first switch set, and a second switch set. The second memory cell has a second storage unit, a third switch set, and a fourth switch set. The second switch set is coupled to a complement first A-port bit line and a complement first B-port bit line, and connected to the first storage unit. The third switch set is connected to a complement second A-port bit line, a complement second B-port bit line, and the second storage unit. Thus, the second memory cell can make use of the third switch set to share the complement first A-port bit line and the complement first B-port bit line with the first memory cell.

11 Claims, 13 Drawing Sheets

TEN-TRANSISTOR DUAL-PORT SRAM WITH SHARED BIT-LINE ARCHITECTURE

BACKGROUND OF THE INVENTION

1. Field of the Invention

The present invention relates to the technical of dual-port static random access memory (SRAM) and, more particularly, to a ten-transistor (10T) dual-port SRAM with shared bit-line architecture.

2. Description of Related Art

In recent years, the IC design demands more transmission bandwidths, such that the memory requirement is evolved from a single-port SRAM into a dual-port SRAM. Because of having advanced feature of parallel operation for high speed communication and video applications which the single-port SRAM does not have, the dual-port SRAM can perform a parallel read or write operation on different ports, but it introduces read/write disturb issues in the same row access.

FIGS. 1(A)-1(D) schematically illustrate an access of a conventional dual-port SRAM. FIG. 1(A) shows an access to an A-port and a B-port at different rows and different columns. FIG. 1(B) shows an access to the A-port and the B-port at different rows and the same column. As shown in FIGS. 1(A) and 1(B), both of the access modes activate only single port on one row. Namely, when an activated memory cell of a word line WL is operated as a single-port access, no access conflict occurs to the access modes of FIGS. 1(A) and 1(B).

FIG. 1(C) shows an access to the A-port and the B-port at the same row and different columns. FIG. 1(D) shows an access to the A-port and the B-port at the same row and the same column. In this case, there is an access conflict on the access modes of FIGS. 1(C) and 1(D).

FIG. 1(C) shows that, when the memory cell 110 on the left of row 1 executes a read/write operation at the A-port, the A-port of the memory cell 120 becomes a dummy read, with the bit lines BL pre-charged to high. When the B-port attempts to write a low voltage (0) in the memory cell 120 through the bit line, the internal storage node of the memory cell 120 is difficult to change its storage state, which is referred to as a write data disturb.

FIG. 2 shows a schematic diagram of a conventional write data disturb. For an access to the memory cells 110, 120, all the bit lines are pre-charged to a high voltage (1). When the A-port attempts to execute a read/write operation on the left, i.e., the memory cell 110, the word line WL, i.e., AWL1, is first activated to the high voltage (1). In this case, when the B-port attempts to write a low voltage (0) in the memory cell 120 through the bit line BBL2, the word line WL, i.e., BWL1, is activated to a high voltage (H), and the bit line BBL2 is low (0). Since the word lines AWL1 and BWL1 are high (1), the transistors N1 and N2 are all turned on, so as to bring the bit line ABL2 to high (1) and the bit line BBL2 to low (0). Thus, the bit line ABL2 is pulled up, so that the internal storage node X of the memory cell 120 is difficult to change its storage state.

FIG. 3 shows a schematic diagram of a conventional read data disturb. For an access to the memory cells 110, 120, all the bit lines are pre-charged to a high voltage (1). When the A-port attempts to execute a read/write operation on the left, i.e., the memory cell 110, the word line WL, i.e., AWL1, is first activated to the high voltage (1), and the transistor N1 is turned on. Since the word line ABL2 is pre-charged to high (1), the internal storage node X is slightly pulled up to a voltage, denoted as 0+, by the bit line ABL2 as it stores a data with the low voltage (0), so that a read data disturb occurs. Namely, when the voltage 0+ of the internal storage node X of the memory cell 120 is read through the bit line BBL2 and amplified by a sensing amplifier, it can easily cause an erroneous read data.

To overcome the write data disturb and the read data disturb, in Koji Nii, Yasumasa Tsukamoto, Makoto Yabuuchi, Yasuhiro Masuda, Susumu Imaoka, Keiichi Usui, Shigeki Ohbayashi, Hiroshi Makino, and Hirofumi Shinohara, "Synchronous Ultra-High-Density 2RW Dual-Port 8T-SRAM With Circumvention of Simultaneous Common-Row-Access," IEEE Journal of Solid-State Circuits, Vol. 44, No. 3, March 2009, pp. 977-986, it uses a row-address comparator to detect whether the same row is accessed and, if yes, the B-port row decoder is turned off to avoid the conflict of concurrently accessing the A-port and the B-port. However, such a way reduces the entire access efficiency and has to add the column-address comparator and peripherals, resulting in increased cost.

Accordingly it is desirable to provide an improved dual-port SRAM to mitigate and/or obviate the aforementioned problems.

SUMMARY OF THE INVENTION

The object of the present invention is to provide a ten-transistor (10T) dual-port SRAM with shared bit-line architecture, which can share adjacent bit lines, cancel read/write disturb, and expand the static noise margin. Furthermore, the total number of bit lines can be reduced to half so as to reduce the read/write power consumption on charging a bit line. As compared with the conventional 8T dual-port SRAM, the present invention can reduce the bit-line leakage.

According to a feature of the present invention, there is provided a ten-transistor (10T) dual-port SRAM with shared bit-line architecture, which includes a first memory cell and a second memory cell. The first memory cell has a first storage unit, a first switch set, and a second switch set. The first switch set is connected to a first A-port bit line, a first B-port bit line, and the first storage unit. The second switch set is coupled to a complement first A-port bit line and a complement first B-port bit line, and connected to the first storage unit. The second memory cell has a second storage unit, a third switch set, and a fourth switch set. The third switch set is connected to the complement first A-port bit line, the complement first B-port bit line, and the second storage unit. The fourth switch set is coupled to a second A-port bit line and a second B-port bit line, and connected to the second storage unit. Thus, the second memory cell can make use of the third switch set to share the complement first A-port bit line and the complement first B-port bit line with the first memory cell.

According to another feature of the present invention, there is provided a ten-transistor (10T) dual-port SRAM with shared bit-line architecture, which includes a storage unit, a first switch set, and a second switch set. The storage unit is comprised of a latch and has a first storage node and a second storage node. The first switch set includes first to fourth switches. The first switch has one end connected to a first A-port bit line, a control terminal connected to an A-port word line, and the other end connected to one end of the second switch. The second switch has the other end connected to the first storage node and a control terminal connected to a first-column A-port control line. The third switch has one end connected to a first B-port bit line, a control terminal connected to a B-port word line, and the other end connected to one end of the fourth switch. The fourth switch has the other end connected to the first storage node and a control terminal connected to a first-column B-port control line. The second switch set includes fifth to sixth switches.

The fifth switch has one end connected to the second storage node and a control terminal connected to the first-column A-port control line. The sixth switch has one end connected to the second storage node and a control terminal connected to the first-column B-port control line.

Other objects, advantages, and novel features of the invention will become more apparent from the following detailed description when taken in conjunction with the accompanying drawings.

DETAILED DESCRIPTION OF THE PREFERRED EMBODIMENT

Figure 4:
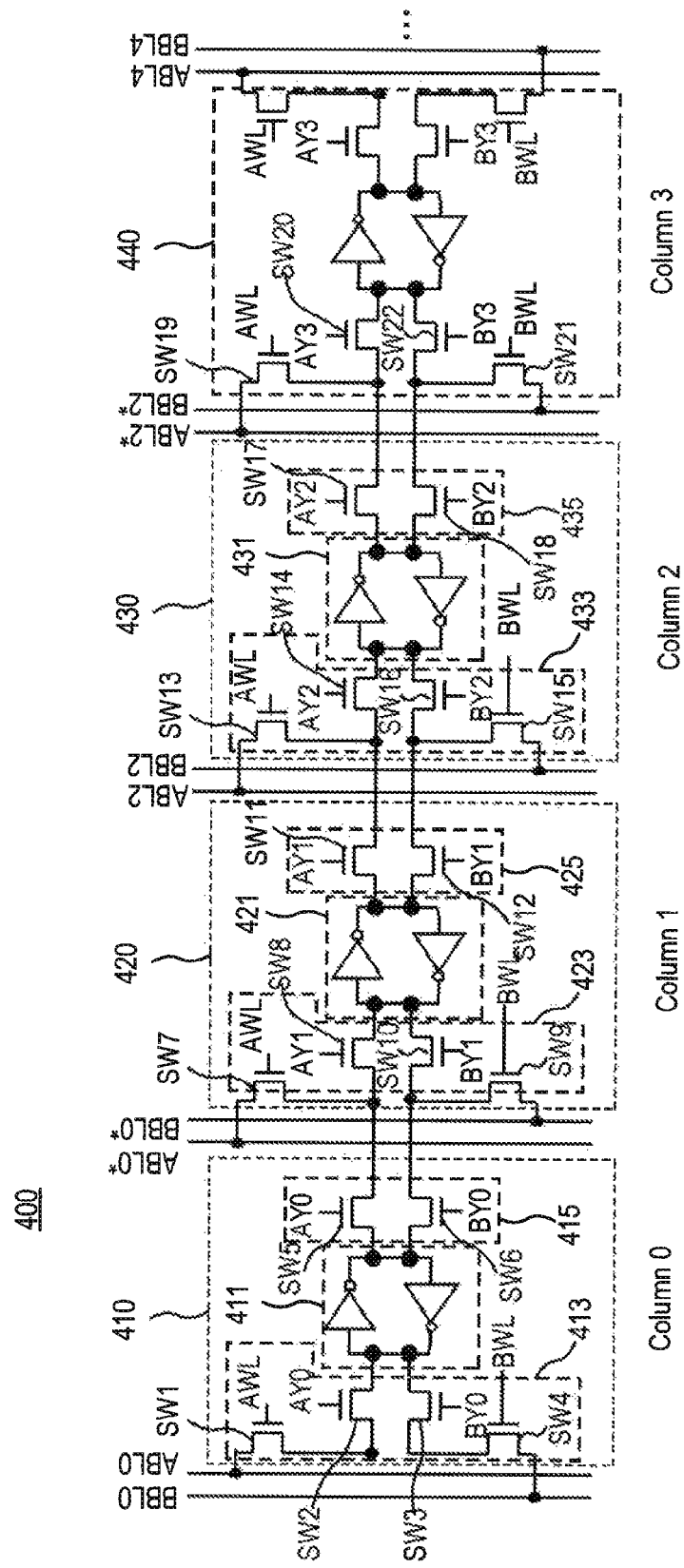
FIG. 4 is a schematic diagram of a ten-transistor (10T) dual-port SRAM with shared bit-line architecture according to the invention.

FIG. 4 is a schematic diagram of a ten-transistor (10T) dual-port SRAM with shared bit-line architecture according to the invention. The 10T dual-port SRAM includes a first memory cell 410, a second memory cell 420, and a third memory cell 430.

The first memory cell 410 has a first storage unit 411, a first switch set 413, and a second switch set 415. The first switch set 413 is connected to a first A-port bit line ABL0, a first B-port bit line BBL0, and the first storage unit 411. The second switch set 415 is coupled to a complement first A-port bit line ABL0* and a complement first B-port bit line BBL0*, and is connected to the first storage unit 411.

The second memory cell 420 has a structure as same as the first memory cell 410. Namely, the second memory cell 420 has a second storage unit 421, a third switch set 423, and a fourth switch set 425. The third switch set 423 is connected to the complement first A-port bit line ABL0*, the complement first B-port bit line BBL0*, and the second storage unit 421. The fourth switch set 425 is coupled to a second A-port bit line ABL2 and second B-port bit line BBL2, and is connected to the second storage unit 421.

As shown in FIG. 4, the second memory cell 420 makes use of the third switch set 423 to share the complement first A-port bit line ABL0* and the complement first B-port bit line BBL0* with the first memory cell 410.

The third memory cell 430 has a third storage unit 431, a fifth switch set 433, and a sixth switch set 435. The fifth switch set 433 is connected to the second A-port bit line ABL2, the second B-port bit line BBL2, and the third storage unit 431. The sixth switch set 435 is coupled to a complement second A-port bit line ABL2* and a complement second B-port bit line BBL2*, and is connected to the third storage unit 431. Thus, the third memory cell 430 can make use of the fifth switch set 433 to share the second A-port bit line ABL2 and the second B-port bit line BBL2 with the second memory cell 420.

In the present invention, the first switch set 413, the third switch set 423, and the fifth switch set 433 have the same structure while the second switch set 415, the fourth switch set 425, and the sixth switch set 435 have the same structure.

Figure 5:
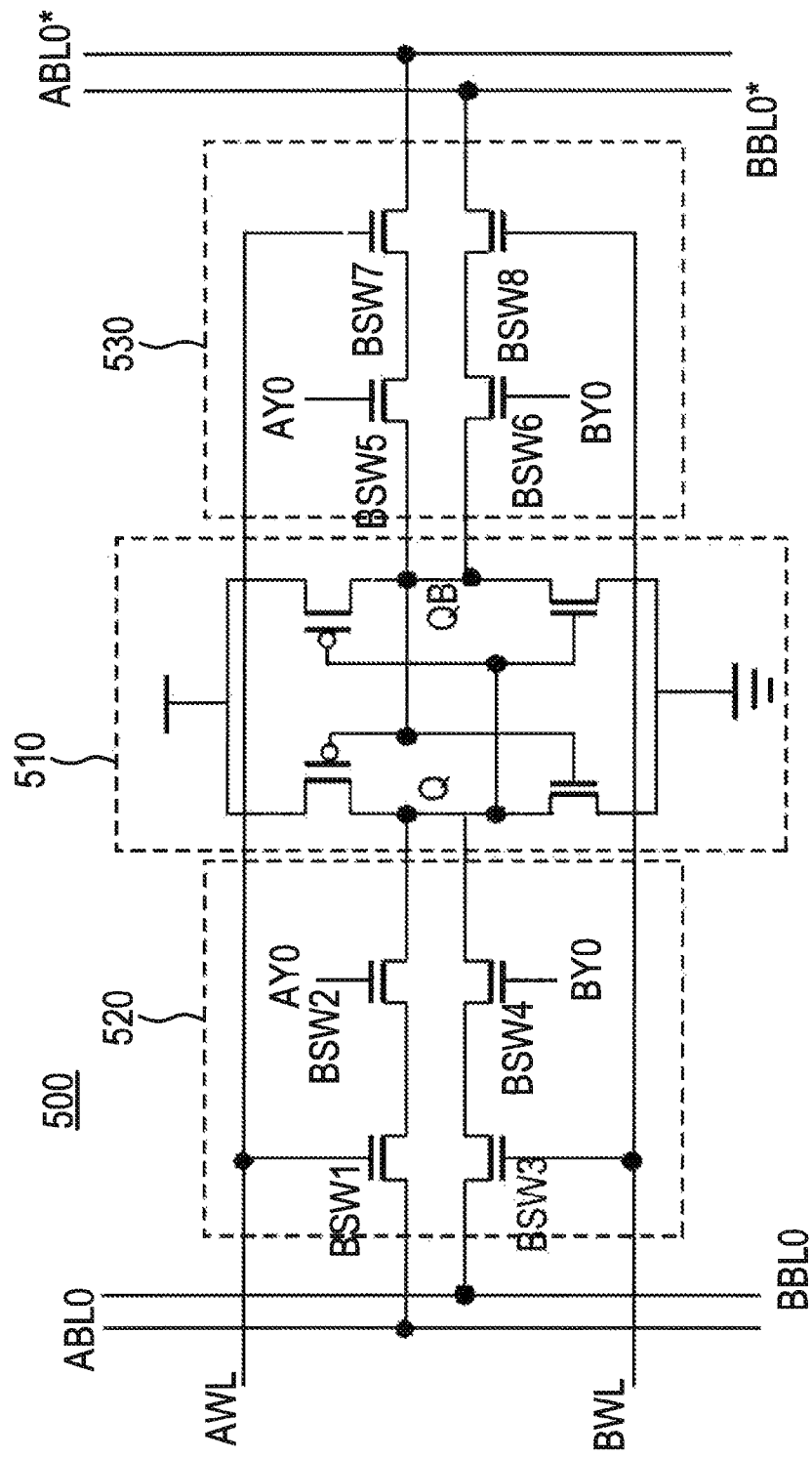
FIG. 5 is a schematic diagram of a dual-port SRAM cell according to the invention.

In the present invention, the first memory cell 410, second memory cell 420, and third memory cell 430 are originated from the circuit of FIG. 5, which is a schematic diagram of a dual-port SRAM cell 500 according to the invention. The dual-port SRAM cell 500 includes a storage unit 510, a first switch set 520, and a second switch set 530.

The storage unit 510 is comprised of a latch and has a first storage node Q and a second storage node QB.

The first switch set 520 has first to fourth switches BSW1-BSW4. The first switch BSW1 has one end connected to a first A-port bit line ABL0, a control terminal connected to an A-port word line AWL, and the other end connected to one end of the second switch BSW2. The second switch BSW2 has the other end connected to the first storage node Q and a control terminal connected to a first-column A-port control line AY0.

The third switch BSW3 has one end connected to a first B-port bit line BBL0, a control terminal connected to a B-port word line BWL, and the other end connected to one end of the fourth switch BSW4, while the fourth switch BSW4 has the other end connected to the first storage node Q and a control terminal connected to a first-column B-port control line BY0.

The second switch set 530 includes fifth to sixth switches BSW5-BSW6. The fifth switch BSW5 has one end connected to the second storage node QB and a control terminal connected to the first-column A-port control line AY0. The sixth switch BSW6 has one end connected to the second storage node QB and a control terminal connected to the first-column B-port control line BY0.

The second switch set 530 further includes seventh to eighth switches BSW7-BSW8. The seventh switch BSW7 has one end connected to the other end of the fifth switch BSW5, a control terminal connected to an A-port word line AWL, and the other end connected to a complement first A-port bit line ABL0*. The eighth switch BSW8 has one end connected to the other end of the sixth switch BSW6, a control terminal connected to a B-port word line BWL, and the other end connected to a complement first B-port bit line BBL0*.

With reference to both FIGS. 4 and 5, the first memory cell 410, the second memory cell 420, and the third memory cell 430 in FIG. 4 are evolved from the circuit of the cell 500 in FIG. 5. Namely, at the right side of first memory cell 410, the seventh switch BSW7 and eighth switch BSW8 are removed and the first switch BSW1 and second switch BSW2 of the second memory cell 420 are shared since their control terminals are all connected to the A-port word line AWL. Also, the first switch BSW1 and second switch BSW2 of the second memory cell 420 are connected to the complement first A-port bit line ABL0* and the complement first B-port bit line BBL0*. Thus, the second switch set 415 is coupled to the complement first A-port bit line ABL0* and the complement first B-port bit line BBL0*. Similarly, the fourth switch set 425 is coupled to the second A-port bit line ABL2 and the second B-port bit line BBL2. The sixth switch set 435 is coupled to the complement second A-port bit line ABL2* and the complement second B-port bit line BBL2*.

As shown in FIG. 4, the first switch set 413 has first to fourth switches SW1-SW4, the second switch set 415 has fifth and sixth switches SW5-SW6, the third switch set 423 has seventh to tenth switches SW7-SW10, and the fourth switch set 425 has eleventh and twelfth switches SW11-SW12.

The first switch SW1 has one end connected to the first A-port bit line ABL0, a control terminal connected to the A-port word line AWL, and the other end connected to one end of the second switch SW2. The second switch SW2 has the other end connected to the first storage node of the first storage unit 411 and a control terminal connected to a first-column A-port control line AY0. The third switch SW3 has one end connected to the first B-port bit line BBL0, a control terminal connected to a B-port word line BWL, and the other end connected to one end of the fourth switch SW4. The fourth switch SW4 has the other end connected to the first storage node of the first storage unit 411 and a control terminal connected to a first-column B-port control line BY0. The fifth switch SW5 has one end connected to the second storage node of the first storage unit 411, a control terminal connected to the first-column A-port control line AY0, and the other end connected to one end of the seventh switch SW7. The sixth switch SW6 has one end connected to the second storage node of the first storage unit 411, a control terminal connected to the first-column B-port control line BY0, and the other end connected to one end of the ninth switch SW9.

The seventh switch SW7 has one end connected to the complement first A-port bit line ABL0*, a control terminal connected to the A-port word line AWL, and the other end connected to one end of the eighth switch SW8 and the other end of the fifth switch SW5. The eighth switch SW8 has the other end connected to the first storage node of the second storage unit 421 and a control terminal connected to a second-column A-port control line AY1. The ninth switch SW9 has one end connected to the complement first B-port bit line BBL0*, a control terminal connected to the B-port word line BWL, and the other end connected to one end of the tenth switch SW10. The tenth switch SW10 has the other end connected to the first storage node of the second storage unit 421 and a control terminal connected to a second-column B-port control line BY1. The eleventh switch SW11 has one end connected to the second storage node of the second storage unit 421 and a control terminal connected to the second-column A-port control line AY1. The twelfth switch SW12 has one end connected to the second storage node of the second storage unit 421 and a control terminal connected to the second-column B-port control line BY1.

The remaining switches in FIG. 4 have similar connection as cited above, and thus a detailed description is deemed unnecessary. The first to twelfth switches SW1-SW12 are each an NMOS transistor. The first, second, third storage units 411, 421, 431 are each a latch comprised of two inverters.

Figure 6:
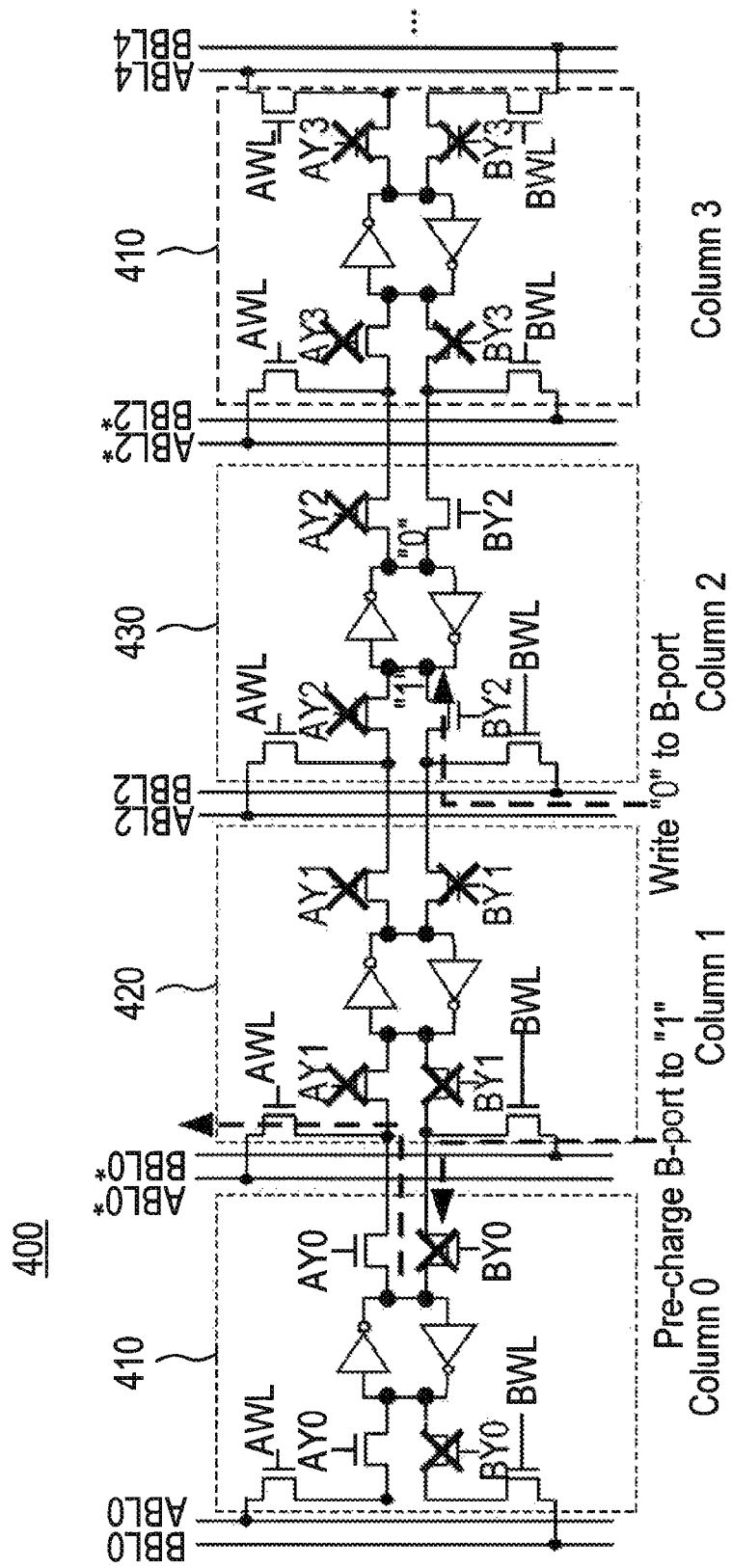
FIG. 6 is a schematic diagram of concurrently accessing A-port and B-port of a ten-transistor (10T) dual-port SRAM with shared bit-line architecture according to the invention.

FIG. 6 is a schematic diagram of concurrently accessing A-port and B-port of a ten-transistor (10T) dual-port SRAM 400 with shared bit-line architecture according to the invention. As shown in FIG. 6, an A-port read in Column 0 is performed, and a B-port write in Column 2 is performed to write a low voltage (0).

All bit lines are pre-charged to a high voltage prior to an access. Since the access is performed on the A-port in Column 0 and the B-port in Column 2, the A-port word line AWL and the B-port word line BWL are at the high voltage on the access, and the 1-st, 3-rd, 7-th, 9-th, 13-th, 15-th, 19-th, 21-th switches SW1, SW3, SW7, SW9, SW13, SW15, SW19, SW21 are activated. Since the first-column A-port control line AY0 is at the high voltage when a data read from the A-port in Column 0 is performed, the remaining-column A-port control lines (AY1, AY2, AY3, . . . ) are at a low voltage, so that only the second switch SW2 and the fifth switch SW5 are activated. In addition, since the third-column B-port control line BY2 is at the high voltage when a data write to the B-port in Column 2 is performed, the remaining-column B-port control lines (BY1, BY2, BY3, . . . ) are at the low voltage, so that only the 16-th switch SW16 and the 18-th switch SW18 are activated.

Since the third-column A-port control line AY2 is at the low voltage, the data of the third storage unit 431 is not influenced because the 14-th switch is turned off, even the second A-port bit line ABL2 is pre-charged to the high voltage. Accordingly, the data write to the third storage unit 431 can be accurately performed through the B-port in Column 2, and there is no write data disturb.

Since the data write to the B-port in Column 2 is performed, the B-port bit line in the same row is pre-charged to the high voltage. In this case, the third-column B-port control line BY2 is at the high voltage because the data write to the B-port in Column 2 is performed only, and the remaining-column B-port control lines (BY0, BY1, BY3, . . . ) are at the low voltage, so the 6-th switch is turned off. Thus, the data read from the first storage unit 411 is not influenced, and there is no read data disturb.

Figure 7A:
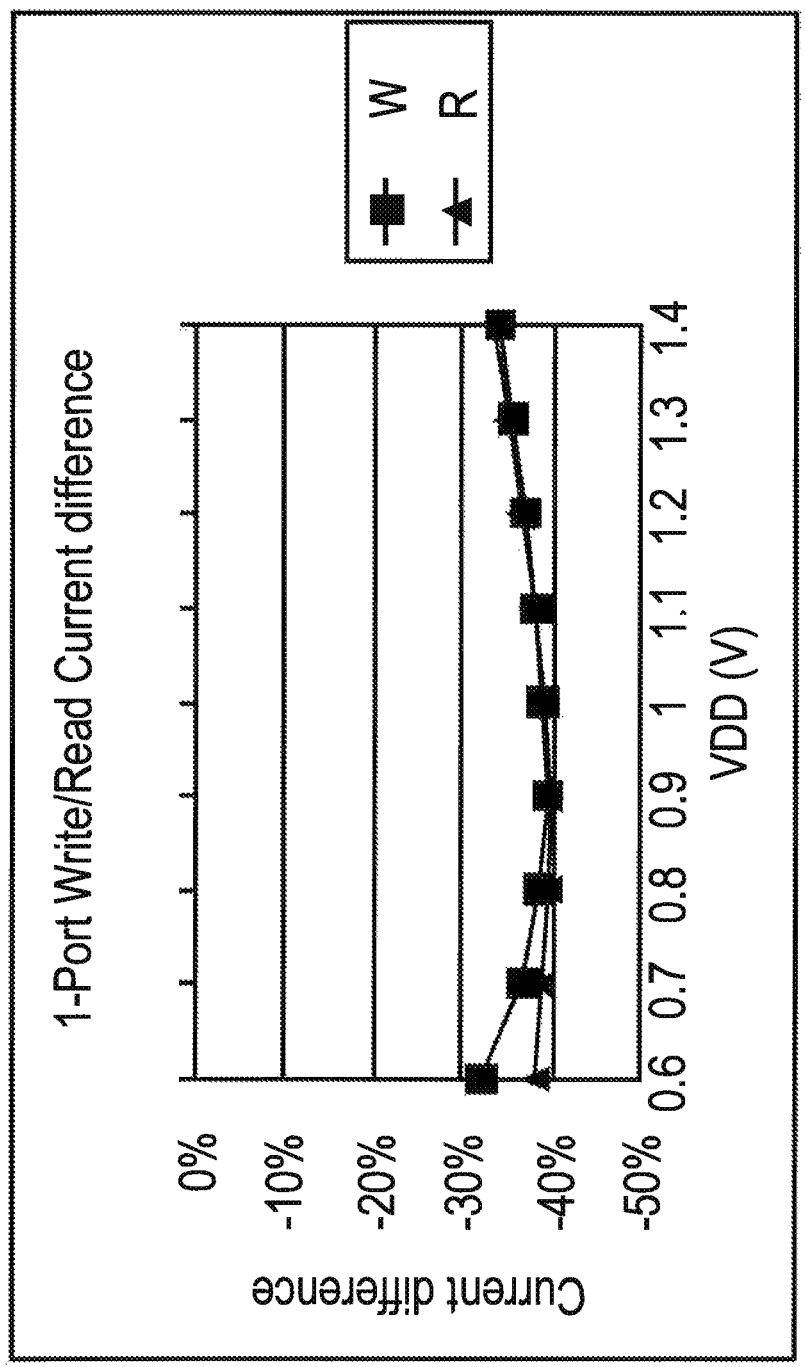
FIGS. 7(A) and 7(B) schematically illustrate a comparison of current consumption between the present invention and the prior art.
Figure 7B:
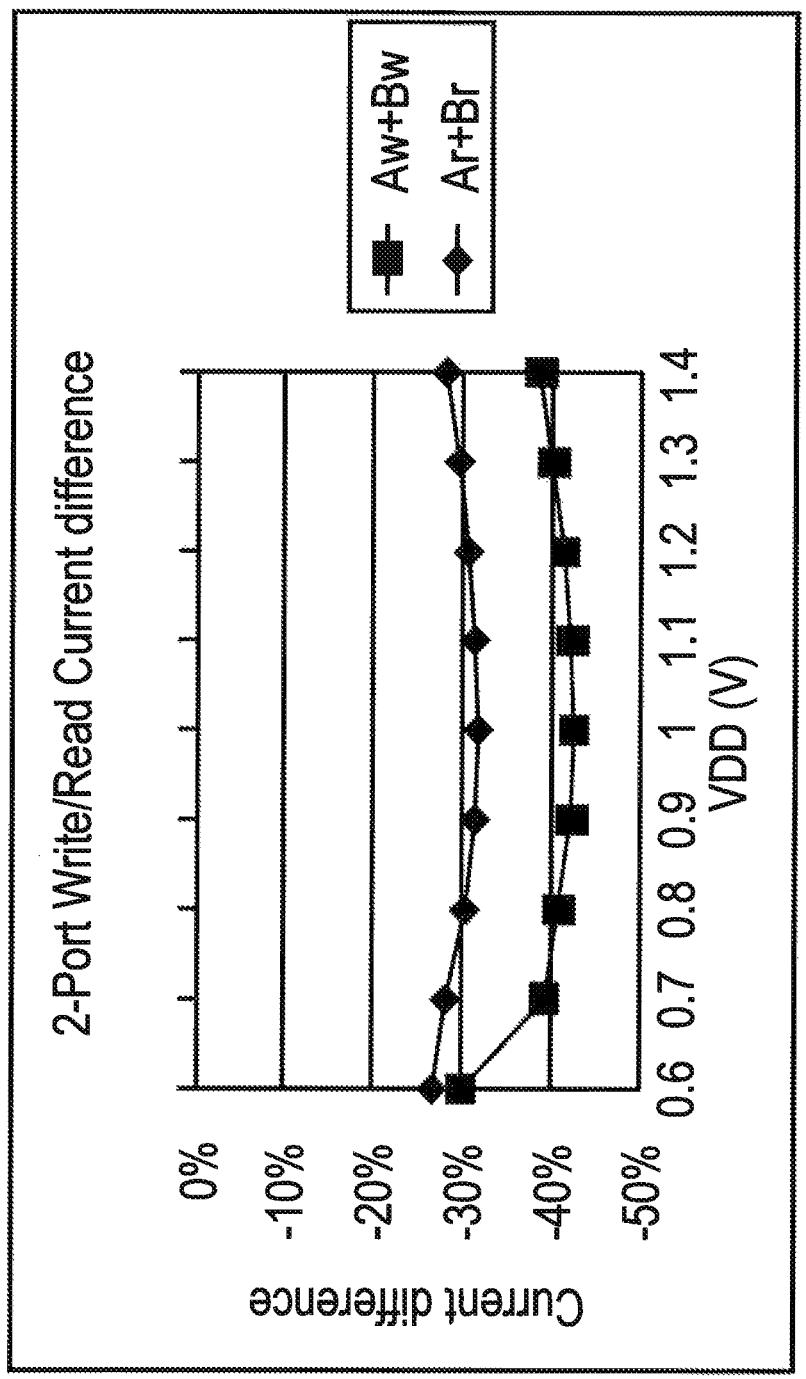

As cited, there is no dummy read operation in the present invention, and thus the current consumption can be effectively reduced. FIGS. 7(A) and 7(B) schematically illustrate a comparison of current consumption between the present invention and the prior art. FIG. 7(A) shows a comparison of current consumption for a 1-port write/read operation. As shown in FIG. 7(A), the present invention can reduce approximately 40% current consumption compared with the prior art in either write or read operation at VDD=0.9V. FIG. 7(B) shows a comparison of current consumption for a 2-port write/read operation. As shown in FIG. 7(B), at VDD=1V and VDD=1.1V, the present invention can reduce the current consumption of more than 40% in write operation and of more than 30% in read operation in comparison with the prior art.

Figure 1A:
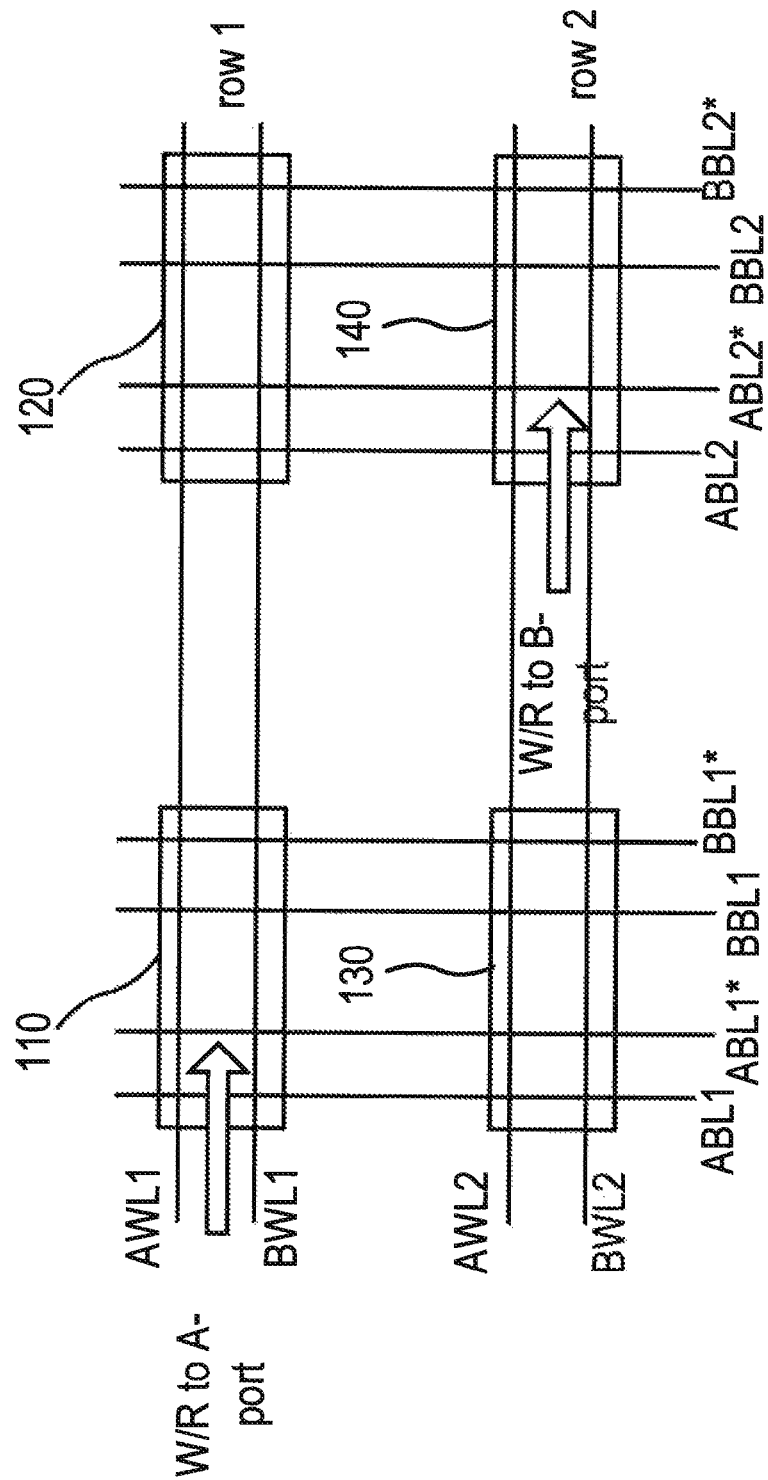
FIGS. 1(A)-1(D) schematically illustrate an access of a conventional dual-port SRAM.
Figure 1B:
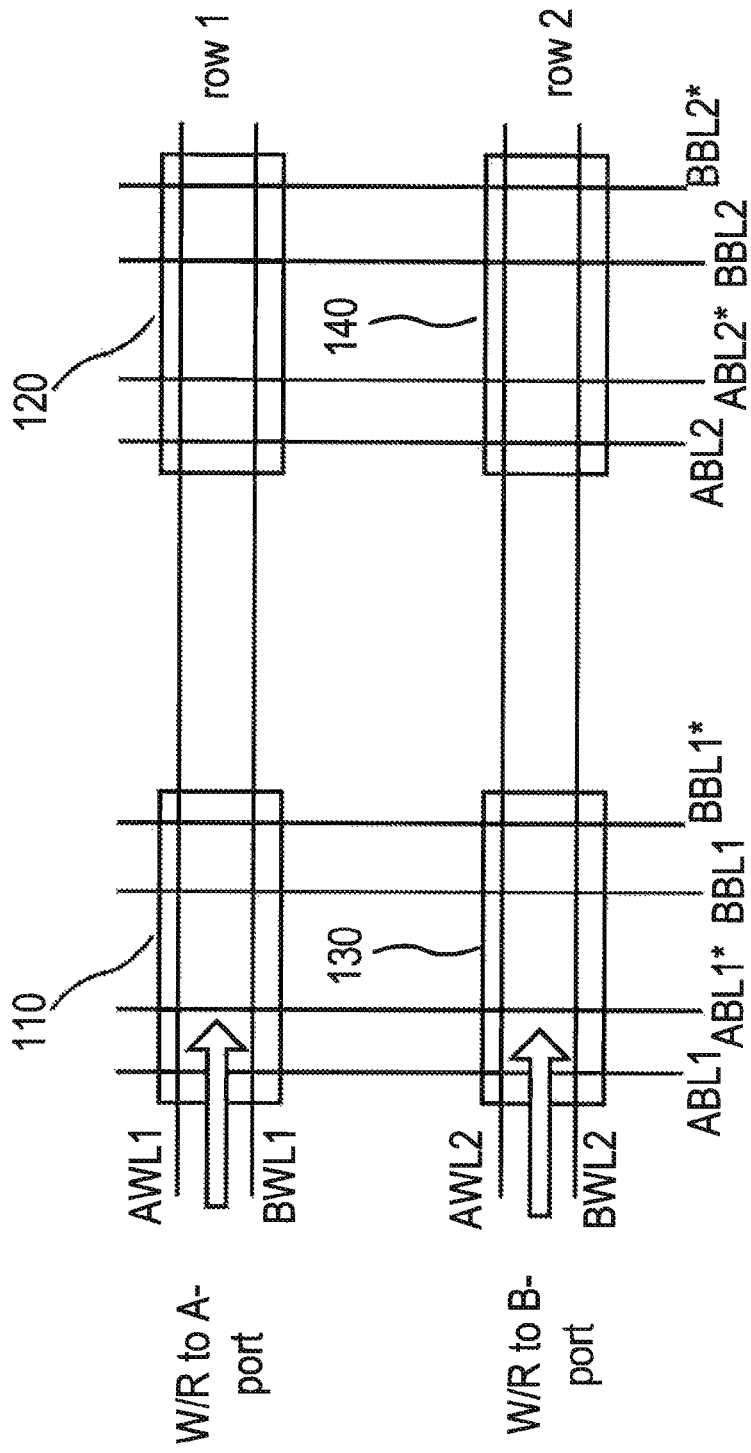
Figure 1C:
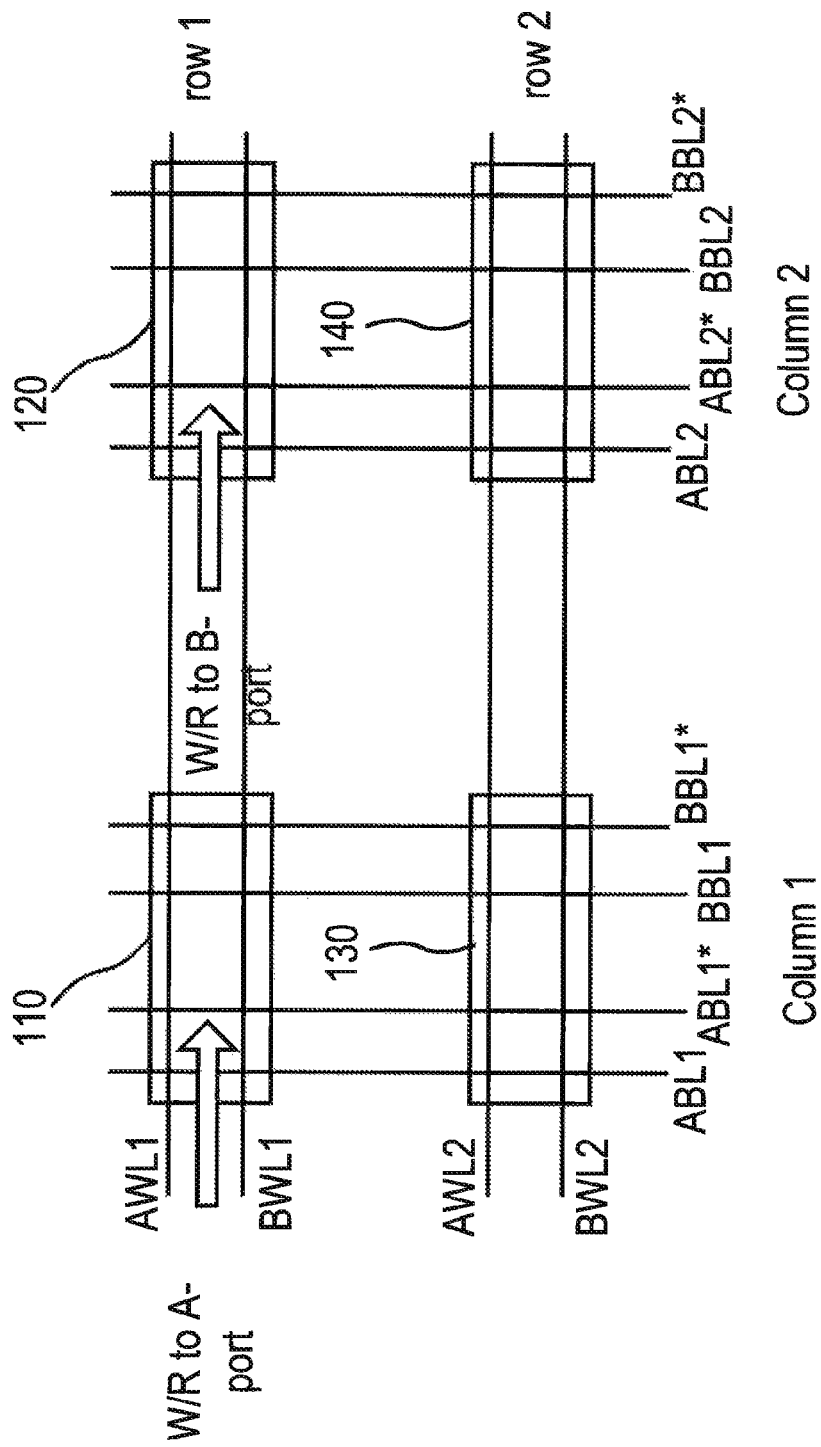
Figure 1D:
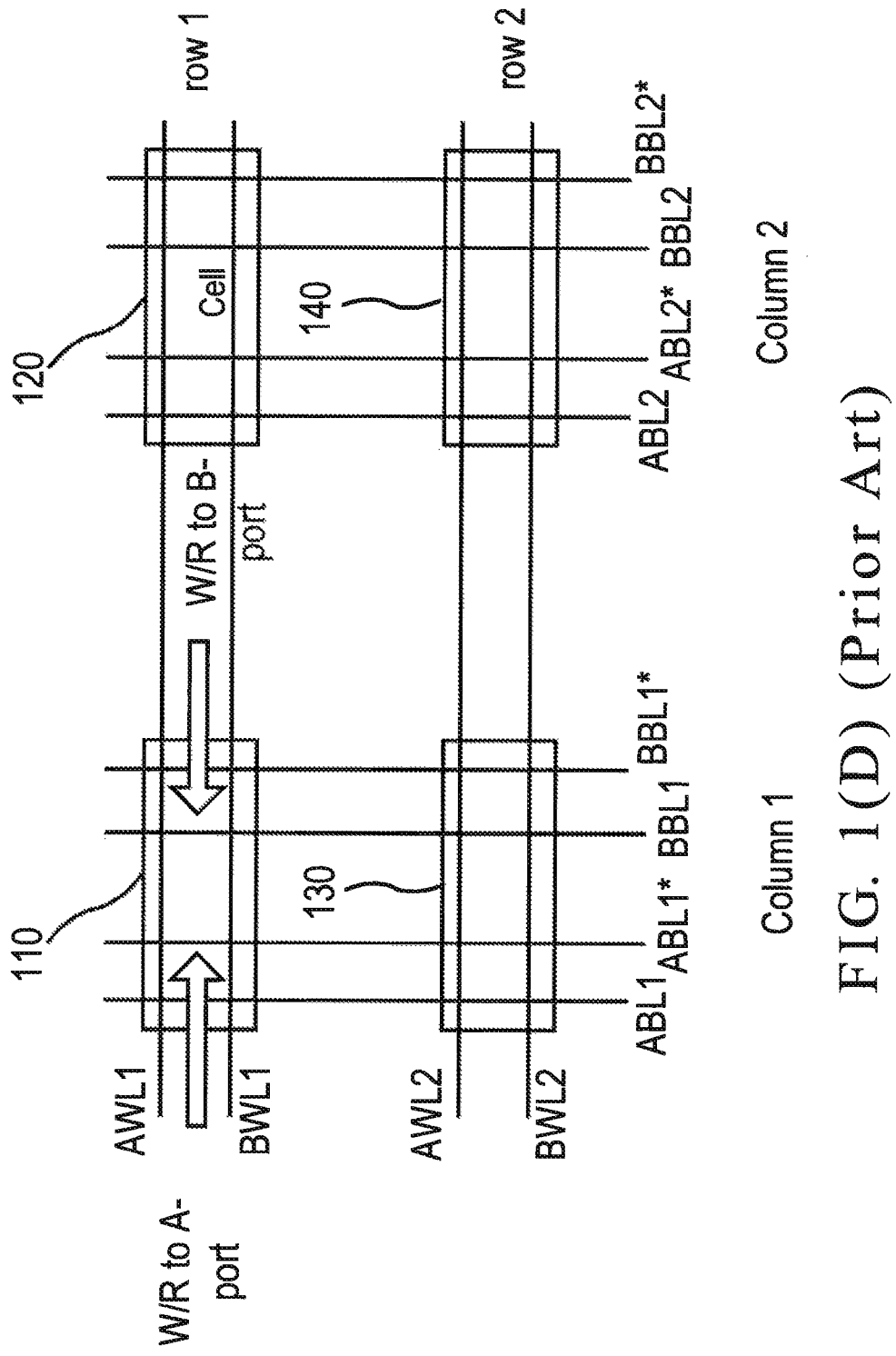
Figure 2:
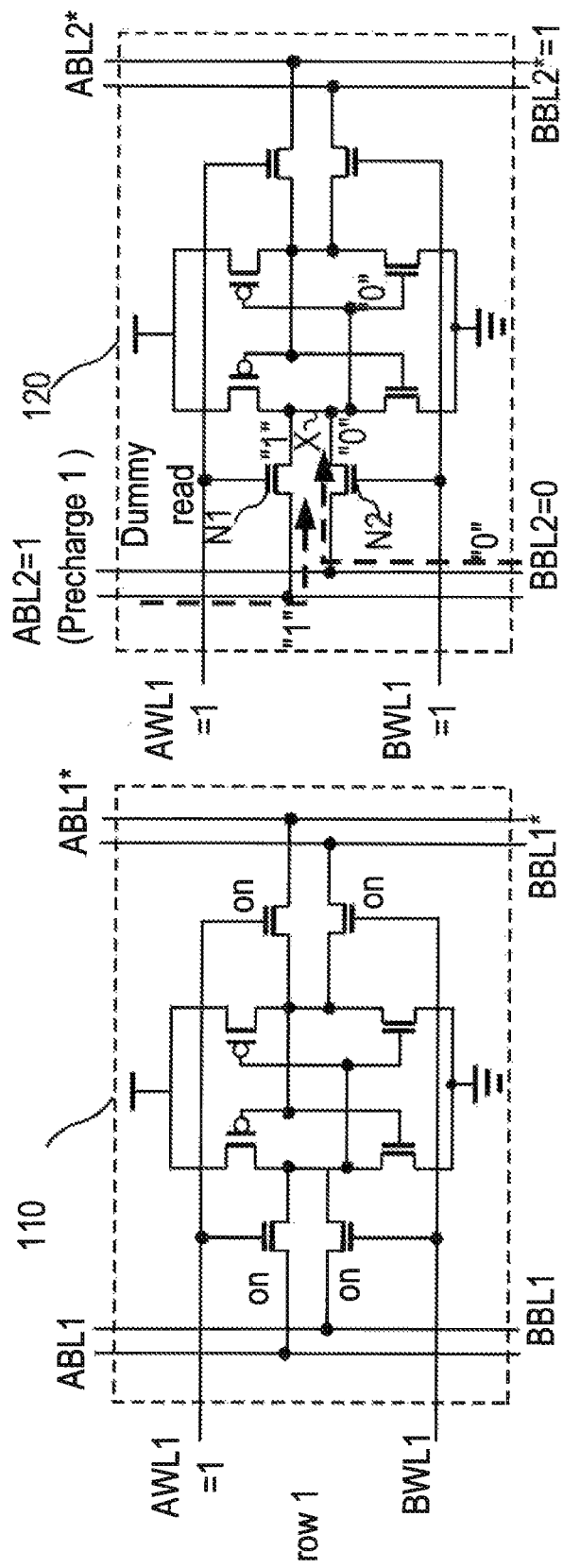
FIG. 2 shows a schematic diagram of a conventional write data disturb.
Figure 3:
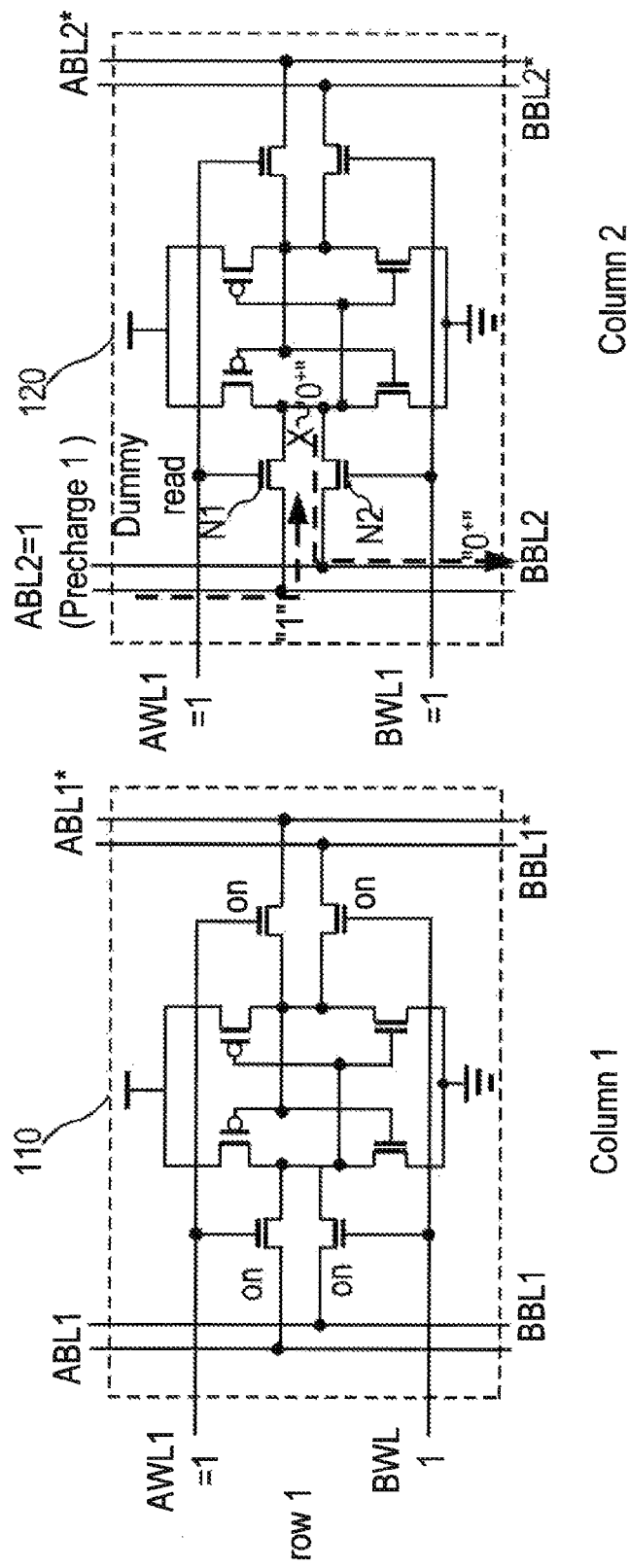
FIG. 3 shows a schematic diagram of a conventional read data disturb.
Figure 8:
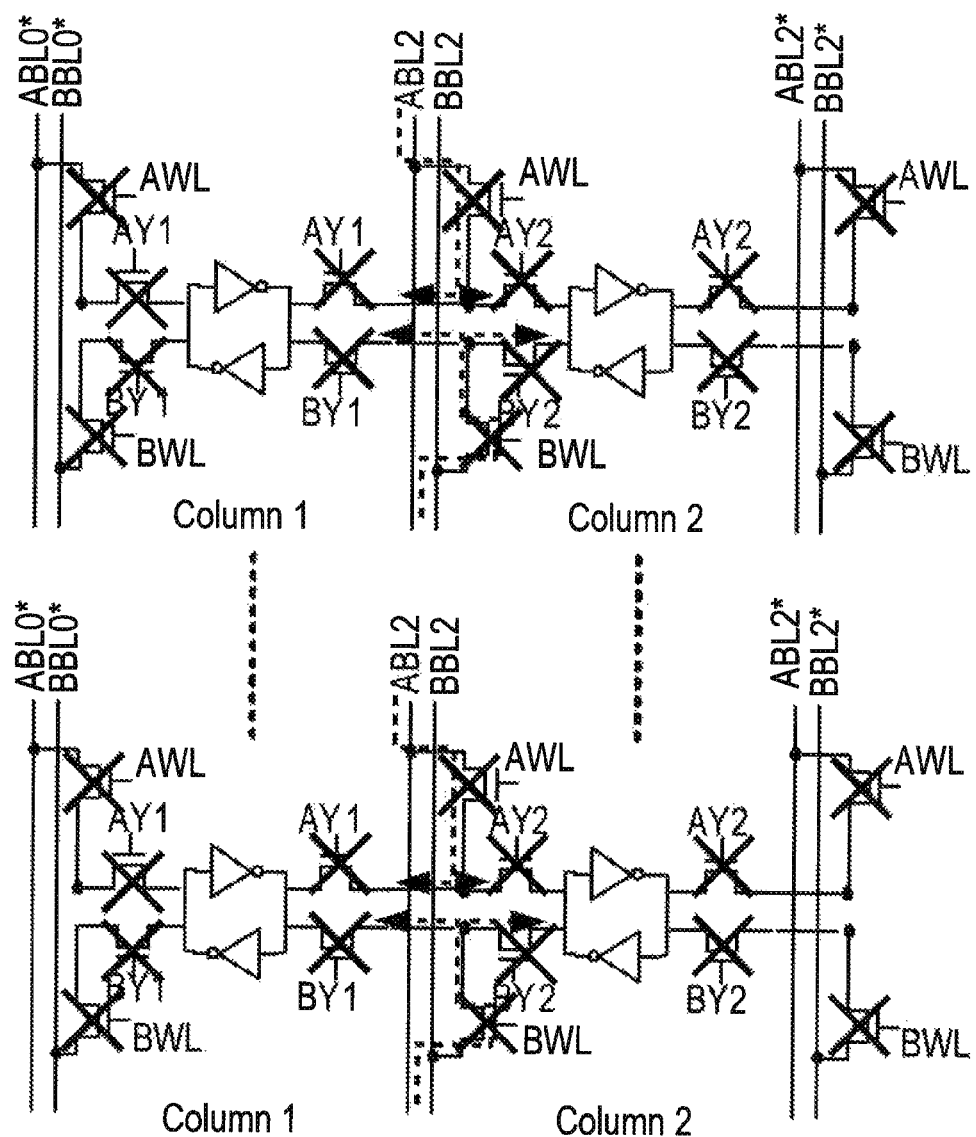
FIG. 8 is a schematic diagram of a current leakage path according to the invention.

FIG. 8 is a schematic diagram of a leakage current path according to the invention. As shown in FIG. 8, at a hold or standby state, the data lines are pre-charged to the high voltage, and the switches are inactivated. In the present invention, the leakage current goes to a storage unit by passing through two inactivated switches connected in series. By contrast, in FIG. 2, the leakage current goes to a storage unit by passing through one inactivated switch controlled by the word line AWL. Therefore, the leakage current in the present invention is smaller than that in the prior art.

Figure 9:
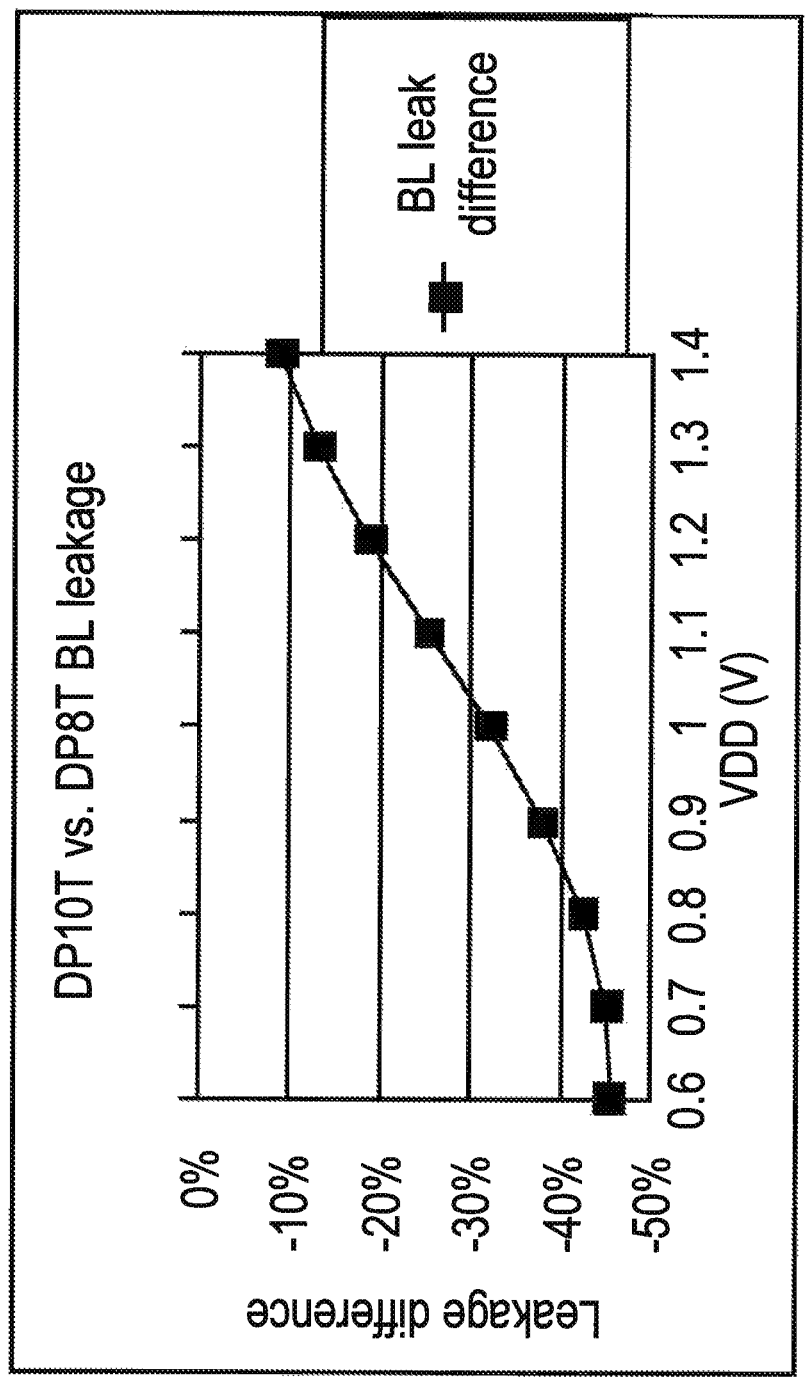
FIG. 9 schematically illustrates a comparison of current leakage between the present invention and the prior art.

FIG. 9 schematically illustrates a comparison of current leakage between the present invention and the prior art. As shown, the present invention can reduce the current leakage approximately to 50% in comparison with the prior art at VDD=0.6V. In addition, the total number of bit lines required in the present invention can be reduced to half than that in prior art, such that the entire current leakage is reduced over 50%.

In view of the foregoing, it is known that the present invention provides a 10T dual-port SRAM with shared bit-line architecture, which can share adjacent bit lines, cancel read/write disturb, and expand the static noise margin. Furthermore, the total number of bit lines can be reduced to half thereby reducing the read/write power consumption on charging a bit line. As compared with the conventional 8T dual-port SRAM, the present invention can reduce the bit-line leakage.

Although the present invention has been explained in relation to its preferred embodiment, it is to be understood that many other possible modifications and variations can be made without departing from the spirit and scope of the invention as hereinafter claimed,

What is claimed is:

1. A 10-transistor dual-port SRAM with shared bit-line architecture, comprising:
    a first memory cell having a first storage unit, a first switch set, and a second switch set, the first switch set being connected to a first A-port bit line, a first B-port bit line, and the first storage unit, the second switch set being coupled to a complement first A-port bit line and a complement first B-port bit line, and connected to the first storage unit; and
    a second memory cell having a second storage unit, a third switch set, and a fourth switch set, the third switch set being connected to the complement first A-port bit line, the complement first B-port bit line, and the second storage unit, the fourth switch set being coupled to a second A-port bit line and a second B-port bit line, and connected to the second storage unit,
    wherein the second memory cell makes use of the third switch set to share the complement first A-port bit line and the complement first B-port bit line with the first memory cell.

2. The 10-transistor dual-port SRAM with shared bit-line architecture as claimed in claim 1, further comprising:
    a third memory cell having a third storage unit, a fifth switch set, and a sixth switch set, the fifth switch set being connected to the second A-port bit line, the second B-port bit line, and the third storage unit, the sixth switch set being coupled to a complement second A-port bit line and a complement second B-port bit line, and connected to the third storage unit,
    wherein the third memory cell makes use of the fifth switch set to share the second A-port bit line and the second B-port bit line with the second memory cell.

3. The 10-transistor dual-port SRAM with shared bit-line architecture as claimed in claim 2, wherein the first, the third, and the fifth switches have same structure, and the second, the fourth, and the sixth switches have same structure.

4. The 10-transistor dual-port SRAM with shared bit-line architecture as claimed in claim 3, wherein the first switch set has a first, a second, a third, and a fourth switches, the second switch set has a fifth and a sixth switches, the third switch set has a seventh, an eighth, a ninth, and a tenth switches, and the fourth switch set has an eleventh and a twelfth switches.

5. The 10-transistor dual-port SRAM with shared bit-line architecture as claimed in claim 4, wherein the first switch has one end connected to the first A-port bit line, a control terminal connected to an A-port word line, and the other end connected to one end of the second switch; the second switch has the other end connected to the first storage unit and a control terminal connected to a first-column A-port control line; the third switch has one end connected to the first B-port bit line, a control terminal connected to a B-port word line, and the other end connected to one end of the fourth switch; the fourth switch has the other end connected to the first storage unit and a control terminal connected to a first-column B-port control line; the fifth switch has one end connected to the first storage unit, a control terminal connected to the first-column A-port control line, and the other end connected to one end of the seventh switch; the sixth switch has one end connected to the first storage unit, a control terminal connected to the first-column B-port control line, and the other end connected to one end of the ninth switch.

6. The 10-transistor dual-port SRAM with shared bit-line architecture as claimed in claim 5, wherein the seventh switch has one end connected to the complement first A-port bit line, a control terminal connected to the A-port word line, and the other end connected to one end of the eighth switch and the other end of the fifth switch; the eighth switch has the other end connected to the second storage unit and a control terminal connected to a second-column A-port control line; the ninth switch has one end connected to the complement first B-port bit line, a control terminal connected to the B-port word line, and the other end connected to one end of the tenth switch; the tenth switch has the other end connected to the second storage unit and a control terminal connected to a second-column B-port control line; the eleventh switch has one end connected to the second storage unit and a control terminal connected to the second-column A-port control line; the twelfth switch has one end connected to the second storage unit and a control terminal connected to the second-column B-port control line.

7. The 10-transistor dual-port SRAM with shared bit-line architecture as claimed in claim 6, wherein the first to twelve switches are each an NMOS transistor.

8. The 10-transistor dual-port SRAM with shared bit-line architecture as claimed in claim 7, wherein the first, second and third storage units are each a latch.

9. The 10-transistor dual-port SRAM with shared bit-line architecture as claimed in claim 8, wherein the latch is comprised of two inverters.

10. A dual-port SRAM cell, comprising:
    a storage unit comprised of a latch and having a first storage node and a second storage node;
    a first switch set having a first switch, a second switch, a third switch, and a fourth switch, wherein the first switch has one end connected to the first A-port bit line, a control terminal connected to an A-port word line, and the other end connected to one end of the second switch; the second switch has the other end connected to the first storage node and a control terminal connected to a first-column A-port control line; the third switch has one end connected to the first B-port bit line, a control terminal connected to a B-port word line, and the other end connected to one end of the fourth switch; the fourth switch has the other end connected to the first storage node and a control terminal connected to a first-column B-port control line; and
    a second switch set having a fifth switch and a sixth switch, wherein the fifth switch has one end connected to the second storage node and a control terminal connected to the first-column A-port control line; and the sixth switch has one end connected to the second storage node and a control terminal connected to the first-column B-port control line.

11. The dual-port SRAM cell as claimed in claim 10, wherein the second switch set further comprises a seventh switch and an eighth switch, such that the fifth switch has the other end connected to one end of the seventh switch; the seventh switch has a control terminal connected to an A-port word line and the other end connected to a first A-port complement bit line; the sixth switch has the other end connected to one end of the eighth switch; the eighth switch has a control terminal connected to a B-port word line and the other end connected to a first B-port complement bit line.

* * * * *